(12) United States Patent
Grenet et al.

(10) Patent No.: US 9,459,098 B2
(45) Date of Patent: Oct. 4, 2016

(54) SYSTEM FOR MEASURING A MAGNETIC FIELD COMPRISING A THREE-AXIS SENSOR FOR MEASURING A MAGNETIC FIELD THAT IS ABLE TO MOVE TOGETHER WITH A CARRIER THAT DISRUPTS THE MEASUREMENTS, AND ASSOCIATED METHOD

(75) Inventors: Pierre Grenet, Grenoble (FR); Ismaïl El-Marfouq, Antibes (FR); Viviane Cattin, Saint Egreve (FR)

(73) Assignees: Movea, Grenoble (FR); Commissariat A L'energie Atomique et Aux Energies Alternatives, Paris (FR)

( * ) Notice: Subject to any disclaimer, the term of this patent is extended or adjusted under 35 U.S.C. 154(b) by 1725 days.

(21) Appl. No.: 12/992,385

(22) PCT Filed: May 14, 2009

(86) PCT No.: PCT/EP2009/055803
§ 371 (c)(1),
(2), (4) Date: Mar. 11, 2011

(87) PCT Pub. No.: WO2009/138441
PCT Pub. Date: Nov. 19, 2009

(65) Prior Publication Data
US 2011/0153233 A1   Jun. 23, 2011

(30) Foreign Application Priority Data
May 14, 2008   (FR) ..................... 08 02605

(51) Int. Cl.
*G01C 17/38* (2006.01)
*G01R 33/02* (2006.01)
*G01R 33/025* (2006.01)

(52) U.S. Cl.
CPC ............. *G01C 17/38* (2013.01); *G01R 33/025* (2013.01); *G01R 33/0206* (2013.01)

(58) Field of Classification Search
CPC ........................................ G01C 17/38
USPC ...................... 702/57, 92; 33/356; 177/25.14
See application file for complete search history.

(56) References Cited

U.S. PATENT DOCUMENTS

| 5,134,369 A | 7/1992 | Lo et al. |
| 5,182,514 A | 1/1993 | Rice et al. |

(Continued)

FOREIGN PATENT DOCUMENTS

| EP | 0041892 A | 12/1981 |
| EP | 0226653 A | 7/1987 |

(Continued)

OTHER PUBLICATIONS

International Search Report from PCT/EP2009/055803, issued Jun. 26, 2009.

(Continued)

*Primary Examiner* — Lam Nguyen
(74) *Attorney, Agent, or Firm* — Stroock & Stroock & Lavan LLP

(57) ABSTRACT

The magnetic field measurement system comprises a triaxial main sensor (1) for measuring magnetic field that can move jointly with a carrier element (2) capable of generating at least one additional magnetic field disturbing the measurements of said triaxial main sensor (1), said triaxial main sensor (1) being adapted for providing orthonormal measurements for a reference magnetic field in the absence of magnetic disturbances due to said carrier element (2). The system comprises means of adjustment (5, 6, 7, 9, 4a, 4b) of said triaxial main sensor (1) comprising a removable additional sensor for magnetic field measurement, that can move jointly with said carrier element (2), and disposed outside said carrier element (2) away from the additional magnetic field or fields.

13 Claims, 4 Drawing Sheets

(56) References Cited

U.S. PATENT DOCUMENTS

| | | |
|---|---|---|
| 6,122,538 A | 9/2000 | Sliwa et al. |
| 6,130,534 A | 10/2000 | Huang et al. |
| 7,216,055 B1 | 5/2007 | Horton et al. |
| 2002/0100178 A1* | 8/2002 | Smith .................. G01C 17/38 33/356 |
| 2002/0188416 A1 | 12/2002 | Zhou et al. |
| 2003/0149528 A1 | 8/2003 | Lin et al. |
| 2005/0173153 A1 | 8/2005 | Alft et al. |
| 2007/0055468 A1* | 3/2007 | Pylvanainen ........ G01C 17/38 702/92 |
| 2007/0151772 A1* | 7/2007 | Wu ........................ G01S 19/13 177/25.14 |

FOREIGN PATENT DOCUMENTS

| | | |
|---|---|---|
| EP | 0436794 A | 7/1991 |
| EP | 0718598 A | 6/1996 |
| FR | 2663428 A | 12/1991 |
| FR | 2704065 A | 10/1994 |
| FR | 2766935 A | 2/1999 |
| WO | 92/16719 A | 10/1992 |
| WO | 02/46693 A | 6/2002 |

OTHER PUBLICATIONS

Written Opinion from PCT/EP2009/055803, issued Jun. 26, 2009.

* cited by examiner

SYSTEM FOR MEASURING A MAGNETIC FIELD COMPRISING A THREE-AXIS SENSOR FOR MEASURING A MAGNETIC FIELD THAT IS ABLE TO MOVE TOGETHER WITH A CARRIER THAT DISRUPTS THE MEASUREMENTS, AND ASSOCIATED METHOD

This application is a national phase application under §371 of PCT/EP2009/055803, filed May 14, 2009, which claims priority to French Patent Application No. 0802605, filed May 14, 2008, the entire content of which is expressly incorporated herein by reference.

The invention pertains to a magnetic field measurement system comprising a triaxial main sensor for measuring magnetic field that can move jointly with a carrier element capable of generating at least one additional magnetic field disturbing the measurements of said sensor, and an associated method.

A magnetic field measurement sensor can be associated with a carrier element that may cause magnetic disturbances, for example a car or a portable telephone.

BACKGROUND OF THE INVENTION

It is known to attempt to place the sensor so that the magnetic disturbances engendered by the carrier element are minimal. It is also known to employ magnets or other ferromagnetic objects so as to attempt to compensate for the magnetic disturbances.

These schemes are rather unreliable and rather inaccurate, and do not take account of modifications of the ferromagnetic disturbances engendered by the carrier element.

In the case of a scalar sensor, i.e. one delivering solely a magnetic field norm, methods for compensating for the disturbances have been described for example at the URL address http://www.rmsinst.com/aero%20compensation.htm, whereat are described systems for recording data of the company RMS Instruments. Such systems use in a continuous manner a scalar additional reference sensor for the measurements.

This teaching may not be applied to a magnetic field triaxial measurement sensor.

The present invention is aimed at solving the problems mentioned above.

SUMMARY OF THE INVENTION

According to one aspect of the invention, there is proposed a magnetic field measurement system comprising a triaxial main sensor for measuring magnetic field that can move jointly with a carrier element capable of generating at least one additional magnetic field disturbing the measurements of said sensor. Said triaxial main sensor is adapted for providing orthonormal measurements for a reference magnetic field in the absence of magnetic disturbances due to said carrier element. The system comprises means of adjustment of said triaxial main sensor comprising means for determining the reference magnetic field.

The invention makes it possible to adjust or calibrate the triaxial sensor for measuring the magnetic field, in such a way that in routine use it takes account of the magnetic disturbances engendered by the carrier element.

According to one embodiment, said means of adjustment of said triaxial main sensor comprise means for determining the additional magnetic field or fields generated by said carrier element on the basis of parameters comprising coefficients representative of the magnetic sensitivity of said carrier element, measurements performed by said triaxial main sensor, and temporal variations of these said measurements.

It is thus possible to determine simply, accurately and at low cost, the additional magnetic field or fields generated by said carrier element.

In one embodiment, said means for determining the additional magnetic field or fields generated by said carrier element are adapted for implementing the following system of equations:

$$\begin{cases} B_{real_x} = B_{measured_x} - (B_{remanent_x} + A \times V_x) \\ B_{real_y} = B_{measured_y} - (B_{remanent_y} + A \times V_y) \\ B_{real_z} = B_{measured_z} - (B_{remanent_z} + A \times V_z) \end{cases}$$

in which:

$B_{real_x}$, $B_{real_y}$, and $B_{real_z}$ represent the respective components of the real magnetic field along the three axes of the triaxial main sensor;

$B_{measured_x}$, $B_{measured_y}$, and $B_{measured_z}$ represent the respective components of the magnetic field measured by the triaxial main sensor along its three axes;

$B_{remanent_x}$, $B_{remanent_y}$, and $B_{remanent_z}$ represent the respective components of the remanent magnetic field along the three axes of the triaxial main sensor;

$$A = \begin{bmatrix} B_{measured_x}; B_{measured_y}; B_{measured_z}; \\ \dfrac{\partial B_{measured_x}}{\partial t}; \dfrac{\partial B_{measured_y}}{\partial t}; \dfrac{\partial B_{measured_z}}{\partial t} \end{bmatrix};$$

and the vectors $V_x$, $V_y$, and $V_z$ have as components the coefficients representative of the magnetic sensitivity of said carrier element:

$$V_x = \begin{bmatrix} a_{xx}^i \\ a_{yx}^i \\ a_{zx}^i \\ a_{xx}^f \\ a_{yx}^f \\ a_{zx}^f \end{bmatrix} \quad V_y = \begin{bmatrix} a_{xy}^i \\ a_{yy}^i \\ a_{zy}^i \\ a_{xy}^f \\ a_{yy}^f \\ a_{zy}^f \end{bmatrix} \quad V_z = \begin{bmatrix} a_{xz}^i \\ a_{yz}^i \\ a_{zz}^i \\ a_{xz}^f \\ a_{yz}^f \\ a_{zz}^f \end{bmatrix}$$

whose components or coefficients representative of the magnetic sensitivity of said carrier element $a_{jk}^i$ represent respectively the coefficient of proportionality between the value of the disturbance on the axis j due to the axis k and the value of the field on the axis k, for the induced magnetic field, and the components or coefficients representative of the magnetic sensitivity of said carrier element $a_{jk}^f$ represent respectively the coefficient of proportionality between the value of the disturbance on the axis j due to the axis k and the value of the temporal derivative of the field on the axis k, for the magnetic field due to the eddy currents.

The real magnetic field is thus determined accurately with few calculations, without taking account of the magnetic disturbances engendered by the carrier element and measured by the triaxial main sensor.

According to one embodiment, said means for determining the reference magnetic field comprise a predetermined magnetic field generator.

It is thus possible to readily ascertain the reference magnetic field to which the system is subjected.

In one embodiment, said means for determining the reference magnetic field comprise a removable additional sensor for magnetic field measurement, that can move jointly with said carrier element, and disposed outside said carrier element away from the additional magnetic field or fields.

It is thus possible to ascertain readily and at reduced cost the reference magnetic field to which the system is subjected.

For example, said removable additional sensor for magnetic field measurement is a triaxial additional sensor, whose axes are respectively parallel to the axes of the triaxial main sensor.

The use of such a sensor makes it possible to obtain improved accuracy.

For example, said removable additional sensor for magnetic field measurement is a scalar sensor.

This embodiment is less expensive and simpler to carry out.

In the case of a triaxial additional sensor, said means of adjustment of said triaxial main sensor can comprise first calculation means adapted for calculating the respective components of the remanent magnetic field by differences between averages of measurements performed simultaneously by the two triaxial sensors.

Such a calculation is simple to carry out.

For example, said means of adjustment of said triaxial main sensor comprise second means for calculating the vectors of said coefficients representative of the magnetic sensitivity of said carrier element by least squares estimation on the following system of equations:

$$\begin{cases} A \times V_x = (B_{measured_x} - B_{remanent_x}) \\ A \times V_y = (B_{measured_y} - B_{remanent_y}) \\ A \times V_z = (B_{measured_z} - B_{remanent_z}). \end{cases}$$

The invention provides a result of improved accuracy.

As a variant, with a scalar removable additional sensor, said means of adjustment of said triaxial main sensor comprise optimization means adapted for optimizing the following equality for a series of measurements performed simultaneously with said triaxial main sensor and said scalar sensor:

$$\|Mes\_scalar\| = \|B_{measured} - B_{disturbing}\|$$

in which $\|Mes\_scalar\|$ represents a norm of a measurement of the scalar sensor, and $B_{disturbing}$ represents the disturbing additional magnetic field generated by said carrier element such as described above for the means for determining the additional magnetic field or fields generated by said carrier element.

The calculations are simplified. If furthermore, a prior adjustment has been made such as described above with a triaxial additional sensor, it is possible to deduct therefrom negligible components making it possible to further simplify the calculations to be performed.

In one embodiment, the system comprises, furthermore, means for correcting the measurements of said triaxial main sensor which are adapted for delivering the real magnetic field on the basis of the magnetic field measured by the triaxial main sensor and data provided by said adjustment means by using the following system of equations:

$$\begin{cases} B_{real_x} = B_{measured_x} - (B_{remanent_x} + A \times V_x) \\ B_{real_y} = B_{measured_y} - (B_{remanent_y} + A \times V_y) \\ B_{real_z} = B_{measured_z} - (B_{remanent_z} + A \times V_z) \end{cases}$$

According to one embodiment, the system comprises, furthermore, means of predictive correction by consideration of the disturbances of a predictive model, by gradient descent of the additional magnetic field or fields adapted for using the following relation:

$$B_{measured} = (I + [\ V_x(1 \to 3) \quad V_y(1 \to 3) \quad V_z(1 \to 3)\ ]) * Rot * B_0 + \\ [\ V_x(1 \to 3) \quad V_y(1 \to 3) \quad V_z(1 \to 3)\ ] * \frac{\partial}{\partial t}(Rot * B_0)$$

in which:
I represents the identity matrix $$\begin{pmatrix} 1 & 0 & 0 \\ 0 & 1 & 0 \\ 0 & 0 & 1 \end{pmatrix};$$

$B_0$ represents the reference magnetic field;
$V_j(1 \to 3)$ represents the sub-vector of $V_j$ comprising the first three components of $V_j$, (j∈{x;y;z}); and
Rot represents the carrier element rotation matrix.

Thus after adjustment, the measurements of the system take account of the magnetic disturbances engendered by the carrier element.

According to another aspect of the invention, there is also proposed a method of magnetic field measurement by a triaxial main sensor for measuring magnetic field that can move jointly with a carrier element capable of generating at least one additional magnetic field disturbing the measurements of said triaxial main sensor. Said triaxial sensor is adapted for providing orthonormal measurements for a reference magnetic field in the absence of magnetic disturbances due to said carrier element. Said main triaxial sensor is adjusted on the basis of a determination of the reference magnetic field.

In one mode of implementation, the additional magnetic field or fields generated by said carrier element is or are determined on the basis of parameters comprising coefficients representative of the magnetic sensitivity of said carrier element, measurements performed by said triaxial main sensor, and temporal variations of these said measurements.

In one mode of implementation, said determination of the additional magnetic field or fields generated by said carrier element uses the following system of equations:

$$\begin{cases} B_{real_x} = B_{measured_x} - (B_{remanent_x} + A \times V_x) \\ B_{real_y} = B_{measured_y} - (B_{remanent_y} + A \times V_y) \\ B_{real_z} = B_{measured_z} - (B_{remanent_z} + A \times V_z) \end{cases}$$

in which:

$B_{real_x}$, $B_{real_y}$, and $B_{real_z}$ represent the respective components of the real magnetic field according to the axes of the main sensor;

$B_{measured_x}$, $B_{measured_y}$, and $B_{measured_z}$ represent the respective components of the remanent magnetic field measured by the main sensor along its three axes;

$B_{remanent_x}$, $B_{remanent_y}$, and $B_{remanent_z}$ represent the respective components of the remanent magnetic field according to the axes of the main sensor;

$$A = \begin{bmatrix} B_{measured_x}; B_{measured_y}; B_{measured_z}; \\ \frac{\partial B_{measured_x}}{\partial t}; \frac{\partial B_{measured_y}}{\partial t}; \frac{\partial B_{measured_z}}{\partial t} \end{bmatrix};$$

and the vectors $V_x$, $V_y$ and $V_z$ have as components the coefficients representative of the magnetic sensitivity of said carrier element:

$$V_x = \begin{bmatrix} a^i_{xx} \\ a^i_{yx} \\ a^i_{zx} \\ a^f_{xx} \\ a^f_{yx} \\ a^f_{zx} \end{bmatrix} \quad V_y = \begin{bmatrix} a^i_{xy} \\ a^i_{yy} \\ a^i_{zy} \\ a^f_{xy} \\ a^f_{yy} \\ a^f_{zy} \end{bmatrix} \quad V_z = \begin{bmatrix} a^i_{xz} \\ a^i_{yz} \\ a^i_{zz} \\ a^f_{xz} \\ a^f_{yz} \\ a^f_{zz} \end{bmatrix}$$

whose components or coefficients representative of the magnetic sensitivity of said carrier element $a^i_{jk}$ represent respectively the coefficient of proportionality between the value of the disturbance on the axis j due to the axis k and the value of the field on the axis k, for the induced magnetic field, and the components or coefficients representative of the magnetic sensitivity of said carrier element $a^f_{jk}$ represent respectively the coefficient of proportionality between the value of the disturbance on the axis j due to the axis k and the value of the temporal derivative of the field on the axis k, for the magnetic field due to the eddy currents.

BRIEF DESCRIPTION OF DRAWINGS

The invention will be better understood on studying a few embodiments described by way of wholly non-limiting examples and illustrated by the appended drawings in which.

DETAILED DESCRIPTION OF PREFERRED EMBODIMENT

Figure 1:
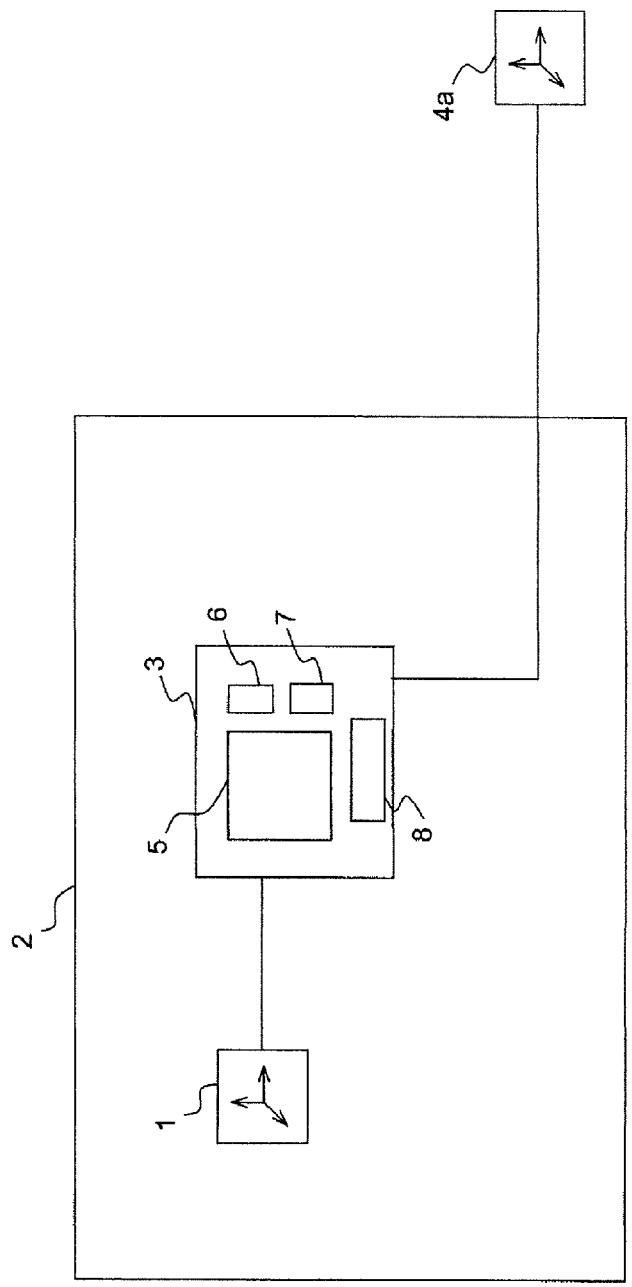
FIG. 1 schematically illustrates a system according to one aspect of the invention with a triaxial removable additional sensor.

As illustrated in FIG. 1, a magnetic field measurement system according to one aspect of the invention comprises a triaxial main sensor 1 for measuring magnetic field, that can move jointly with a carrier element 2 capable of generating at least one additional magnetic field disturbing the measurements of the sensor 1. The carrier element 2 may, for example, be a housing of a portable telephone, of a remote control, of a portable computer, or any other element that can comprise a magnetic field measurement functionality. The triaxial main sensor 1 provides orthonormal measurements for a reference magnetic field in the absence of magnetic disturbances of the carrier element 2. The reference magnetic field for which, in the absence of magnetic disturbances of the carrier element, the measurements provided by the main triaxial sensor 1 are orthonormal, may, for example be the magnetic field at the Earth's surface.

The adjustment of the triaxial main sensor 1 is performed by an electronic control unit 3 and a triaxial removable additional sensor 4a, that can move jointly with the carrier element 2. Stated otherwise, the link between the removable additional sensor 4a and the remainder of the system is a rigid link.

A determination module 5 determines the additional magnetic field or fields generated by the carrier element 2 on the basis of parameters comprising coefficients representative of the magnetic sensitivity of the carrier element 2, measurements performed by the triaxial main sensor 1, and temporal variations of these measurements.

A first calculation module 6 calculates the respective components $B_{remanent_x}$, $B_{remanent_y}$, $B_{remanent_z}$, of the remanent magnetic field $B_{remanent}$ by differences between averages of measurements performed simultaneously by the two triaxial sensors 1 and 4a.

A second calculation module 7 calculates vectors $V_x$, $V_y$, $V_z$ of the coefficients representative of the magnetic sensitivity of the carrier element 2 by least squares estimation on the following system of equations:

$$\begin{cases} A \times V_x = (B_{measured_x} - B_{remanent_x}) \\ A \times V_y = (B_{measured_y} - B_{remanent_y}) \\ A \times V_z = (B_{measured_z} - B_{remanent_z}) \end{cases}$$

A correction module 8 corrects the measurements of the triaxial main sensor 1 so as to deliver the real magnetic field $B_{real}$ on the basis of the magnetic field measured $B_{measured}$ by the triaxial main sensor 1 and data provided by the electronic control unit 3. Exemplary embodiments of the correction module 8 are described subsequently by FIGS. 5 and 6.

Figure 2:
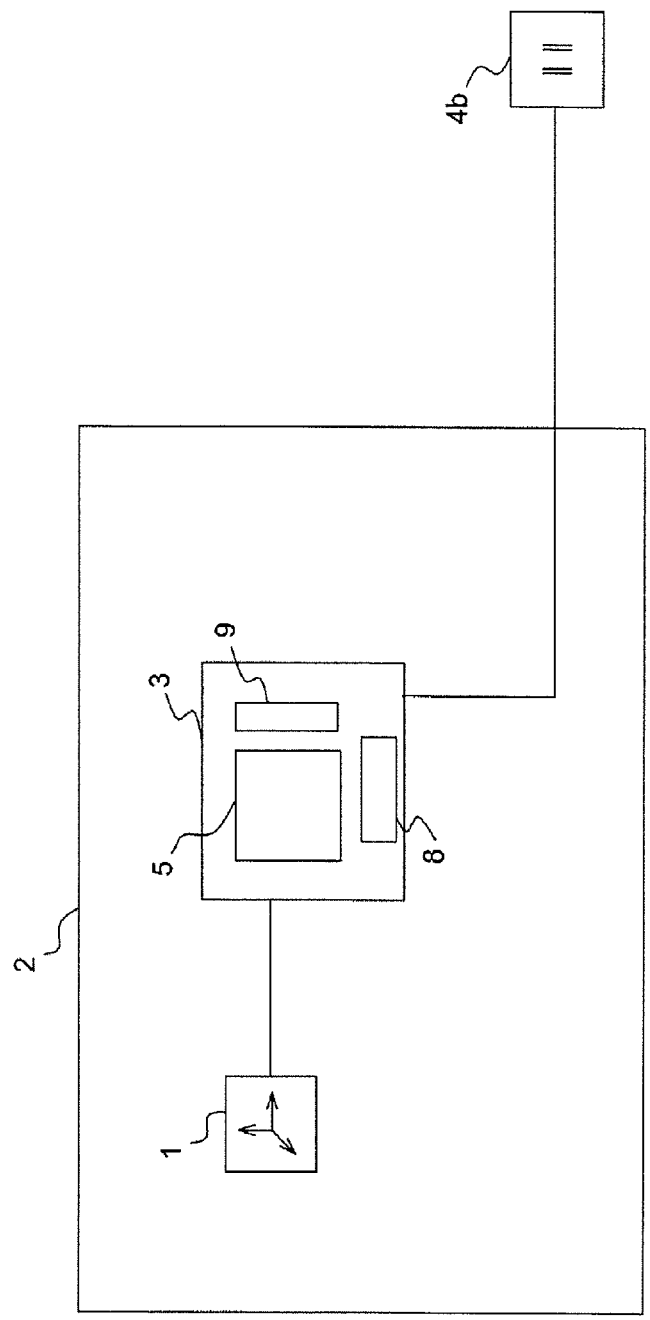
FIG. 2 schematically illustrates a system according to one aspect of the invention with a removable additional sensor.

FIG. 2 represents another embodiment of the invention, in which the removable additional sensor for measuring the magnetic field is a scalar sensor 4b, or, stated otherwise, a sensor providing the norm of a magnetic field, and not its components along three axes like the triaxial sensor 4a of FIG. 1.

The elements of the system having references identical to references of FIG. 1 are elements identical to those of FIG. 1.

The embodiment represented in FIG. 2 does not comprise the calculation modules 6 and 7, but comprises an optimization module 9 for optimizing the following equality for a series of measurements performed simultaneously with the triaxial main sensor 1 and the scalar additional sensor 4b:

$$\|Mes\_scalar\| = \|B_{measured} - B_{disturbing}\|$$

in which $\|\mathrm{Mes\_scalar}\|$ represents a norm of a measurement of the scalar additional sensor 4b, and $\mathrm{B}_{disturbing}$ represents the disturbing additional magnetic field or fields generated by said carrier element 2.

The removable additional sensor, be it triaxial 4a as in the system of FIG. 1, or scalar 4b as in the system of FIG. 2, is used in a phase of adjustment or calibration of the main triaxial sensor 1. In the system's steady operating phase, when the triaxial main sensor 1 is calibrated or adjusted, the removable additional sensor 4a or 4b has been withdrawn.

As a variant of the systems of FIGS. 1 and 2, the system can comprise, in place of a removable additional sensor 4a or 4b serving for the adjustment or calibration of the triaxial main sensor 1, a generator of predetermined magnetic field to which the system is subjected. Thus the reference magnetic field is ascertained completely.

Figure 3:
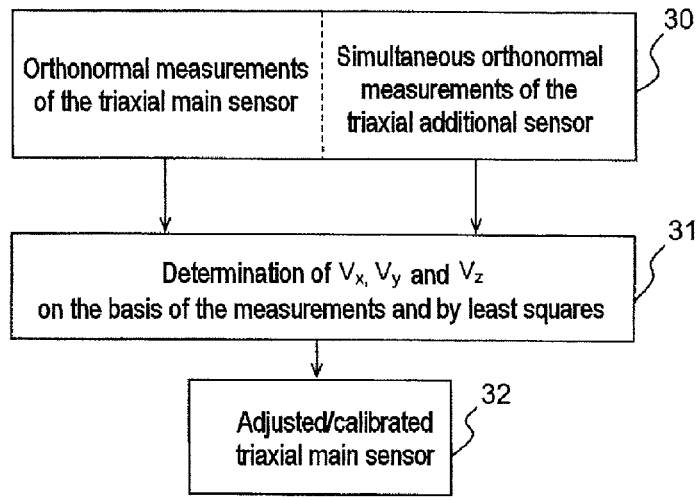
FIG. 3 illustrates the adjustment or calibration of a system of FIG. 1.

FIG. 3 illustrates the calibration of the main triaxial sensor 1 of the system of FIG. 1. Measurements are performed simultaneously (step 30) by the main triaxial sensor 1 and by the additional triaxial sensor 4a. On the basis of these measurements (step 30), the first and second calculation modules 6 and 7 determine the vectors $V_x$, $V_y$, $V_z$ of the coefficients representative of the magnetic sensitivity of the carrier element 2 (step 31) in the manner described previously, by least squares. Thus, the triaxial main sensor 1 is adjusted or calibrated (step 32).

Figure 4:
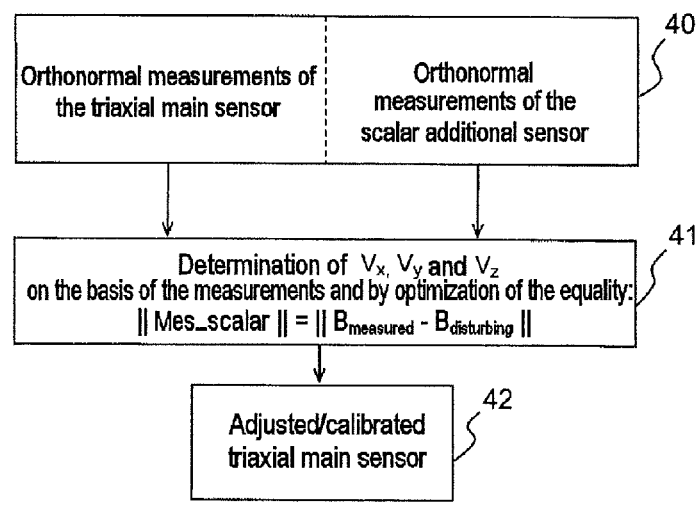
FIG. 4 illustrates the adjustment or calibration of a system of FIG. 2.

FIG. 4 illustrates the calibration of the main triaxial sensor 1 of the system of FIG. 2. Measurements are performed simultaneously (step 40) by the main triaxial sensor 1 and by the additional scalar sensor 4b. On the basis of these measurements (step 40), the optimization module 9 determines the vectors $V_x$, $V_y$, $V_z$ of the coefficients representative of the magnetic sensitivity of the carrier element 2 (step 41) in the manner described previously, by optimization of an equality. Thus, the triaxial main sensor 1 is adjusted or calibrated (step 42).

Figure 5:
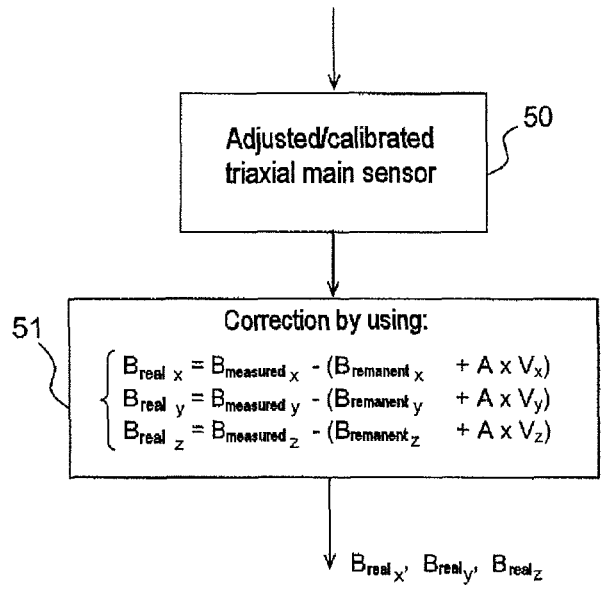
FIG. 5 illustrates the steady-state operation of an embodiment of a system of FIG. 1 or 2.
Figure 6:
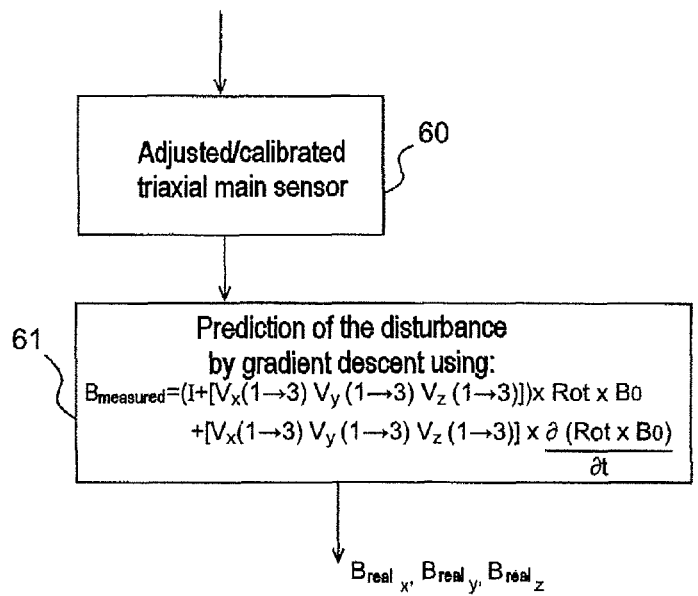
FIG. 6 illustrates the steady-state operation of an embodiment of a system of FIG. 1 or 2.

FIGS. 5 and 6 illustrate the operation of a system according to FIG. 1 or 2 that has been adjusted or calibrated (respectively steps 50 and 60) as illustrated by FIG. 3 or 4.

In the case of FIG. 5, the correction module 8 corrects (step 51) the measurements of the main triaxial sensor 1 so as to deliver the real magnetic field on the basis of these measurements and of data provided by the calculation modules 6 and 7 or by the optimization module 9, depending on the embodiment of the system, by using the following system of equations:

$$\begin{cases} B_{real_x} = B_{measured_x} - (B_{remanent_x} + A \times V_x) \\ B_{real_y} = B_{measured_y} - (B_{remanent_y} + A \times V_y) \\ B_{real_z} = B_{measured_z} - (B_{remanent_z} + A \times V_z) \end{cases}$$

In the case of FIG. 6, the correction module 8 corrects (step 61) the measurements of the main triaxial sensor 1 so as to deliver the real magnetic field by predictive correction by gradient descent using the following relation:

$$B_{measured} = (I + [V_x(1 \to 3) V_y(1 \to 3) V_z(1 \to 3)]) *$$
$$Rot * B_0 + [V_x(1 \to 3) V_y(1 \to 3) V_z(1 \to 3)] * \frac{\partial}{\partial t}(Rot * B_0)$$

in which:
I represents the identity matrix $$\begin{pmatrix} 1 & 0 & 0 \\ 0 & 1 & 0 \\ 0 & 0 & 1 \end{pmatrix};$$

$B_0$ represents the reference magnetic field;
$V_j(1\to 3)$ represents the sub-vector of $V_j$ comprising the first three components of $V_j$, (j∈{x;y;z}); and
Rot represents the carrier element rotation matrix.

The present invention makes it possible to measure, in an accurate manner and at reduced cost, a magnetic field by means of a triaxial sensor tied to carrier element capable of generating at least one additional magnetic field disturbing the measurements, by annihilating the effect of the additional magnetic field or fields on the measurements. The invention makes it possible to eliminate the influence on the measurements of the disturbing magnetic field or fields.

What is claimed is:

1. A triaxial magnetic field measurement system comprising a triaxial main sensor for measuring a magnetic field that can move jointly with a carrier element capable of generating at least one additional magnetic field disturbing measurements of said triaxial main sensor, said triaxial main sensor being configured to provide orthonormal measurements for a reference magnetic field in the absence of magnetic disturbances due to said carrier element, characterized in that the triaxial magnetic field measurement system further comprises means of adjustment of said triaxial main sensor comprising means for determining the reference magnetic field, said means for determining the reference magnetic field comprising a predetermined magnetic field generator or a removable additional sensor for magnetic field measurements, that can move jointly with said carrier element, and that is disposed outside said carrier element away from the additional magnetic field or fields.

2. The system as claimed in claim 1, wherein said means of adjustment of said triaxial main sensor comprises means for determining the additional magnetic field or fields generated by said carrier element on the basis of parameters comprising coefficients representative of a magnetic sensitivity of said carrier element, measurements performed by said triaxial main sensor, and temporal variations of said measurements.

3. The system as claimed in claim 2, wherein said means for determining the additional magnetic field or fields generated by said carrier element is a processing device configured to implement the following system of equations:

$$\begin{cases} B_{real_x} = B_{measured_x} - (B_{remanent_x} + A \times V_x) \\ B_{real_y} = B_{measured_y} - (B_{remanent_y} + A \times V_y), \\ B_{real_z} = B_{measured_z} - (B_{remanent_z} + A \times V_z) \end{cases}$$

in which:
$B_{real_x}$, $B_{real_y}$, and $B_{real_z}$ represent the respective components of a real magnetic field along the three axes of the triaxial main sensor;
$B_{measured_x}$, $B_{measured_y}$, and $B_{measured_z}$ represent respective components of the magnetic field measured by the triaxial main sensor along its three axes;
$B_{remanent_x}$, $B_{remanent_y}$, and $B_{remanent_z}$ represent respective components of a remanent magnetic field along the three axes of the triaxial main sensor;

$$A = [B_{measured_x}; B_{measured_y}; B_{measured_z};$$

$$\frac{\partial B_{measured_x}}{\partial t}; \frac{\partial B_{measured_y}}{\partial t}; \frac{\partial B_{measured_z}}{\partial t}],$$

and
vectors $V_x$, $V_y$ and $V_z$ have as components or the coefficients representative of the magnetic sensitivity of said carrier element, in which:

$$V_x = \begin{bmatrix} a^i_{xx} \\ a^i_{yx} \\ a^i_{zx} \\ a^f_{xx} \\ a^f_{yx} \\ a^f_{zx} \end{bmatrix}, V_y = \begin{bmatrix} a^i_{xy} \\ a^i_{yy} \\ a^i_{zy} \\ a^f_{xy} \\ a^f_{yy} \\ a^f_{zy} \end{bmatrix} \text{ and } V_z = \begin{bmatrix} a^i_{xz} \\ a^i_{yz} \\ a^i_{zz} \\ a^f_{xz} \\ a^f_{yz} \\ a^f_{zz} \end{bmatrix}$$

whose components or coefficients representative of the magnetic sensitivity of said carrier element $a_{jk}{}^i$ represent respectively a coefficient of proportionality between a value of a disturbance on an axis j due to an axis k and a value of a field on the axis k, for an induced magnetic field, and the components or coefficients representative of a magnetic sensitivity of said carrier element $a_{jk}{}^f$ represent respectively a coefficient of proportionality between a value of a disturbance on the axis j due to the axis k and a value of a temporal derivative of the field on the axis k, for a magnetic field due to eddy currents.

4. The system as claimed in claim 1, wherein said means for determining the reference magnetic field comprises a removable additional sensor for magnetic field measurements, and said removable additional sensor is a triaxial additional sensor, whose axes are respectively parallel to the axes of the main triaxial sensor.

5. The system as claimed in claim 1, wherein said means for determining the reference magnetic field comprises a removable additional sensor for magnetic field measurements, and said removable additional sensor for magnetic field measurements is a scalar sensor.

6. The system as claimed in claim 4, wherein said means of adjustment of said triaxial main sensor comprises a calculating circuit configured to calculate the respective components of a remanent magnetic field by differences between averages of measurements performed simultaneously by the two triaxial sensors.

7. The system as claimed in claim 6, wherein said calculating circuit is further configured to calculate the vectors of said coefficients representative of the magnetic sensitivity of said carrier element by least squares estimation on the following system of equations:

$$\begin{cases} A \times V_x = (B_{measured_x} - B_{remanent_x}) \\ A \times V_y = (B_{measured_y} - B_{remanent_y}) \\ A \times V_z = (B_{measured_z} - B_{remanent_z}). \end{cases}$$

8. The system as claimed in claim 5, wherein said means of adjustment of said triaxial main sensor comprises an optimization device configured to optimize the following equality for a series of measurements performed simultaneously with said triaxial main sensor and said scalar sensor:

$$\|Mes\_scalar\| = \|B_{measured} - B_{disturbing}\|,$$

in which $\|Mes\_\|$ scalar represents a norm of a measurement of the scalar sensor, and $B_{disturbing}$ represents the disturbing additional magnetic field or fields generated by said carrier element.

9. The system as claimed in claim 1, further comprising a processing circuit configured to correct the measurements of said triaxial main sensor which are adapted for delivering the real magnetic field on the basis of the magnetic field measured by said triaxial main sensor and data provided by said means of adjustment of said triaxial main sensor by using the following system of equations:

$$\begin{cases} B_{real_x} = B_{measured_x} - (B_{remanent_x} + A \times V_x) \\ B_{real_y} = B_{measured_y} - (B_{remanent_y} + A \times V_y) \\ B_{real_z} = B_{measured_z} - (B_{remanent_z} + A \times V_z) \end{cases}.$$

10. The system as claimed in claim 1, further comprising circuit configured to provide predictive correction by consideration of disturbances of a predictive model, by gradient descent of the additional magnetic field or fields, by using the following relation:

$$B_{measured} = (I + [V_x(1 \to 3) V_y(1 \to 3) V_z(1 \to 3)]) *$$
$$Rot * B_0 + [V_x(1 \to 3) V_y(1 \to 3) V_z(1 \to 3)] * \frac{\partial}{\partial t}(Rot * B_0)$$

in which:
I represents the identity matrix $$\begin{pmatrix} 1 & 0 & 0 \\ 0 & 1 & 0 \\ 0 & 0 & 1 \end{pmatrix};$$

$B_0$ represents the reference magnetic field;
$V_j(1 \to 3)$ represents a sub-vector of $V_j$ comprising the first three components of $V_j$, ($j \in \{x;y;z\}$); and
Rot represents a carrier element rotation matrix.

11. A method of triaxial magnetic field measurement by a triaxial main sensor for measuring a magnetic field, in which the triaxial main sensor moves jointly with a carrier element that generates at least one additional magnetic field disturbing the measurements of said triaxial main sensor, said triaxial main sensor configured to provide orthonormal measurements for a reference magnetic field in the absence of magnetic disturbances due to said carrier element, characterized in that said triaxial main sensor is adjusted on a basis of a determination of the reference magnetic field, said determination of the reference magnetic field using a predetermined magnetic field generator or a removable additional sensor for magnetic field measurements, that can move jointly with said carrier element, and that is disposed outside said carrier element away from the additional magnetic field or fields.

12. The method as claimed in claim 11, wherein the additional magnetic field or fields generated by said carrier element is or are determined on a basis of parameters comprising coefficients representative of a magnetic sensitivity of said carrier element, measurements performed by said triaxial main sensor, and temporal variations of said measurements.

13. The method as claimed in claim 12, wherein said determination of the additional magnetic field or fields generated by said carrier element uses the following system of equations:

$$\begin{cases} B_{real_x} = B_{measured_x} - (B_{remanent_x} + A \times V_x) \\ B_{real_y} = B_{measured_y} - (B_{remanent_y} + A \times V_y) \\ B_{real_z} = B_{measured_z} - (B_{remanent_z} + A \times V_z) \end{cases}$$

in which:

$B_{real_x}$, $B_{real_y}$, and $B_{real_z}$ represent respective components of a real magnetic field along the three axes of the triaxial main sensor;

$B_{measured_x}$, $B_{measured_y}$, and $B_{measured_z}$ represent respective components of the magnetic field measured by the triaxial main sensor along its three axes;

$B_{remanent_x}$, $B_{remanent_y}$, and $B_{remanent_z}$ represent respective components of a remanent magnetic field along the three axes of the triaxial main sensor;

$$A = \left[ B_{measured_x}; B_{measured_y}; B_{measured_z}; \frac{\partial B_{measured_x}}{\partial t}; \frac{\partial B_{measured_y}}{\partial t}; \frac{\partial B_{measured_z}}{\partial t} \right];$$

and vectors $V_x$, $V_y$ and $V_z$ have as components or the coefficients representative of the magnetic sensitivity of said carrier element, in which:

$$V_x = \begin{bmatrix} a_{xx}^i \\ a_{yx}^i \\ a_{zx}^i \\ a_{xx}^f \\ a_{yx}^f \\ a_{zx}^f \end{bmatrix}, \quad V_y = \begin{bmatrix} a_{xy}^i \\ a_{yy}^i \\ a_{zy}^i \\ a_{xy}^f \\ a_{yy}^f \\ a_{zy}^f \end{bmatrix} \text{ and } V_z = \begin{bmatrix} a_{xz}^i \\ a_{yz}^i \\ a_{zz}^i \\ a_{xz}^f \\ a_{yz}^f \\ a_{zz}^f \end{bmatrix}$$

whose components or coefficients representative of the magnetic sensitivity of said carrier element $a_{jk}^i$ represent respectively a coefficient of proportionality between a value of a disturbance on an axis j due to an axis k and a value of the field on the axis k, for an induced magnetic field, and the components or coefficients representative of the magnetic sensitivity of said carrier element $a_{jk}^f$ represent respectively a coefficient of proportionality between a value of a disturbance on the axis j due to the axis k and a value of a temporal derivative of the field on the axis k, for a magnetic field due to eddy currents.

\* \* \* \* \*